United States Patent [19]
Mattson

[11] 4,394,648
[45] Jul. 19, 1983

[54] BRUSH WEAR DETECTOR SYSTEM WITH LATCHING RELAY

[75] Inventor: Richard W. Mattson, Rossford, Ohio

[73] Assignee: Allied Corporation, Toledo, Ohio

[21] Appl. No.: 282,849

[22] Filed: Jul. 13, 1981

[51] Int. Cl.³ .............................................. G08B 21/00
[52] U.S. Cl. .................................. 340/679; 200/61.4; 335/166; 335/168; 340/648
[58] Field of Search ............... 340/679, 648; 200/61.4, 200/41.41; 335/17, 22, 35, 38, 165, 166, 168, 169

[56] References Cited

U.S. PATENT DOCUMENTS

| | | | |
|---|---|---|---|
| 1,729,720 | 10/1929 | Hartwig | 335/165 X |
| 1,971,199 | 8/1934 | Owens | 335/169 |
| 2,247,861 | 7/1941 | Thumim et al. | 335/166 |
| 4,316,186 | 2/1982 | Purdy et al. | 340/648 |
| 4,333,095 | 6/1982 | Silva | 340/679 |

*Primary Examiner*—Glen R. Swann, III
*Attorney, Agent, or Firm*—James P. DeClercq

[57] ABSTRACT

A critical brush wear circuit for a dynamoelectric machine which is not sensitive to stray voltages and currents resulting from brush dust accumulation within the machine, and which may be used over a wide range of voltages, is disclosed. The brush wear detection circuit is provided with a novel memory device shown as a latching relay, formed by two conventional relays disposed perpendicular to each other, with the armatures of each disposed to perpendicularly overlap a portion of the other armature and latch it in energized position when it has been moved to energized position by energizing its coil. One relay is provided with contacts for disabling the coil of the other relay, so that the other relay coil is automatically de-energized after a momentary period of connection, so that it can be allowed to draw high current, since it is not connected long enough for damaging heat to occur. In the preferred embodiment of the invention, the memory device or latching relay receives a critical brush wear signal from an insulated wire embedded in a brush of the dynamoelectric machine, and is provided with two co-wound coils on a common core for connection to brushes of opposite polarities. The memory device or latching relay provides a critical brush wear warning by eliminating a lamp on the memory device package itself, and at a lamp at a central location, connected to several such memory devices for several dynamoelectric machines.

5 Claims, 4 Drawing Figures

BRUSH WEAR DETECTOR SYSTEM WITH LATCHING RELAY

The instant application relates to a brush wear detection system for dynamoelectric machines. In particular, this application relates to a novel latching relay usable in such a system.

BACKGROUND OF THE INVENTION

There are numerous brush wear detection systems which have been proposed to detect the wear of brushes used in dynamoelectric machinery. As is known, detection of critical brush wear is of great advantage, both in allowing replacement of brushes in the dynamoelectric machine at a time when the machine would otherwise be inactive, and in preventing damage to the commutator or slip ring of such a machine by current lead wires embedded in the brush contacting the commutator or slip ring as the brush wears. To provide a brush wear signal, a sensing wire may be embedded in a brush and protrude into the brush a short distance further than the embedded current lead, in the manner disclosed by British Pat. No. 1,262,486 dated Feb. 2, 1972, or by coating a small wire about its periphery and end with a thermoplastic material, chemically abrading its surface, and glueing it into a hole provided in such a brush, or under a loop-type lead of such a brush, as disclosed in co-pending patent applications Ser. Nos. 118,943; 118,944 and 118,945 filed Feb. 6, 1980. Brush holders, or brushes and brush holders have also been modified to provide a critical wear signal, such as disclosed in U.S. Pat. Nos. 2,193,172; 2,691,114; 3,523,288; 3,609,429; 3,898,492; 4,024,525; 4,121,207 and 4,172,988.

Various means have been proposed to provide a brush wear indication based on such a brush wear signal, such as by using inverting transistors where necessary to control a silicon controlled rectifier, as in U.S. Pat. No. 4,024,525, or by commparing the voltage present upon a line providing the brush wear signal with an oscillating voltage, as disclosed in the above-mentioned co-pending patent applications. These circuits provide the desirable feature of providing a sustained warning following a momentary brush wear signal. However, since these circuits utilize semiconductor devices, they must be located away from temperature-producing components, and are also susceptible to leakage currents due to brush dust from worn brushes, yielding a false indication of critical brush wear. At initial assembly, connections to brush wear sensing wires may be insulated with an insulating varnish, but, when brushes are replaced later, in the field, either the time or materials necessary to perform such an insulating step may not be available. If a brush wear indication is based on a voltage on a brush wear sensing wire due to contact with the commutator or slip ring, or a voltage due to contact between a brush and a contact or switching element, a false brush wear signal may be provided by leakage current through brush dust, which usually simulates a high voltage such as would be caused by critical wear of a positive brush.

Latching relays and the like have been made, which are capable of performing a memory function for maintaining a critical brush wear indication until repairs can be conveniently made. Such a function can be performed with two relay or solenoid devices, with a pivoted armature or contact carrier maintained in position by over-center linkages, over-center springs, permanent magnets, residual coil core magnetism, and the like. Some such devices contain numerous moving parts, and are complex in design, difficult to manufacture, and unreliable in operation. Such devices relying on friction or magnetism are apt to give false indications when subjected to vibration. Previous known devices do not provide an electromechanical memory device such as a latching relay which is simple and rugged in construction, and resistant to the vibration levels such as may be found in the preferred usage for such a structure, mobile material handling vehicles.

In accordance with the instant invention, a simplified electromechanical memory device shown as a latching relay, and a critical brush wear detecting system utilizing such a memory device are disclosed. In basic structure, the memory device shown as a latching relay utilizes two conventional relays, mounted perpendicular to each other, portions of the armature of each being capable of substantially perpendicularly over-lapping a portion of the armature of the other relay. It should be noted that for the purposes of this application, the word relay includes solenoid-devices which are not provided with electrical contact pairs, as well as conventional relays, since it will be obvious that a functional device can be built in accordance with the invention without providing electrical contacts on both the solenoid-devices shown and identified as relays herein.

When one of the two perpendicularly-mounted relays is energized, and the second is de-energized, the armature of the second relay will overlap the armature of the first relay, maintaining it in energized position. If the second relay is subsequently energized, its armature will move to energized position, releasing the armature of the first relay. The first relay being de-energized at this time, its armature will maintain the second relay armature in energized position. Should both relays be energized at the same time, an unrealistic condition, whichever relay remains energized the longest will have its armature latched in energized position.

To use such a novel memory element in a critical brush wear detecting system according to the invention, one relay, providing a detection or trip or warning function hereinafter referred to as a set relay is provided with a pair of electrical contacts which actuate a critical brush wear warning device. The second relay, hereinafter referred to as a reset relay, may be energized to remove the critical brush wear indication after critically worn brushes have been renewed, or after the warning system according to the invention has been tested, and is provided with one or more pairs of contacts connected in series with a relay coil of the set relay, to disable this relay coil after it has been energized to provide a critical brush wear indication. In this manner, the relay coil can be used over a wide range of voltages, and made with such a low impedance as to be insensitive to leakage current caused by brush dust. The relay coil may be momentarily severely overloaded, but will not be heated and damaged, since it will be disabled as soon as its armature is moved to energized position, where it will be maintained by the armature of the reset relay.

In the illustrated embodiment of a brush wear warning system according to the invention, the first or set relay is provided with two coils, one for each of the two polarities found in a conventional dynamoelectric machine, one coil being connected to sensing wires associated with positive brushes, and the other coil being associated with negative or ground brushes. Although embedded sensing wires are disclosed, it would be obvious to substitute mechanical switching elements which provide a switch closure upon critical brush wear. However, such structures are believed undesirable as being unduly fragile, or as applying undesired pressures which may cause a brush to bind in its brush holder.

Therefore, it is a first object of the invention to provide a simplified structure for a latching relay. It is a feature of the invention that two conventional relays are mounted at right angles to each other, in a perpendicular relationship, so that the armature of each, in de-energized position, may overlap a portion of the opposite relay armature and maintain it in energized position. It is an advantage of the invention that a memory device or latching relay may be formed using the simple and rugged structure of two conventional relays.

It is a second objective of the invention to provide a brush wear warning system using the novel structure of a memory device or latching relay according to the invention. It is a feature of the invention that a first or set relay of a memory device according to the invention is connected to a means for providing a critical brush wear signal, through contacts controlled by a second or reset relay of the memory device, the first relay thus being electrically de-energized when its armature is mechanically latched in energized position. It is an advantage of the invention that a wide range of voltages provided by the means for providing a critical brush wear warning signal may be accommodated by a memory device according to the invention, since the first or set relay coil will be energized only momentarily, and can safely maintain even a severe overload for a short time.

DESCRIPTION OF THE PREFERRED EMBODIMENT

Figure 1:
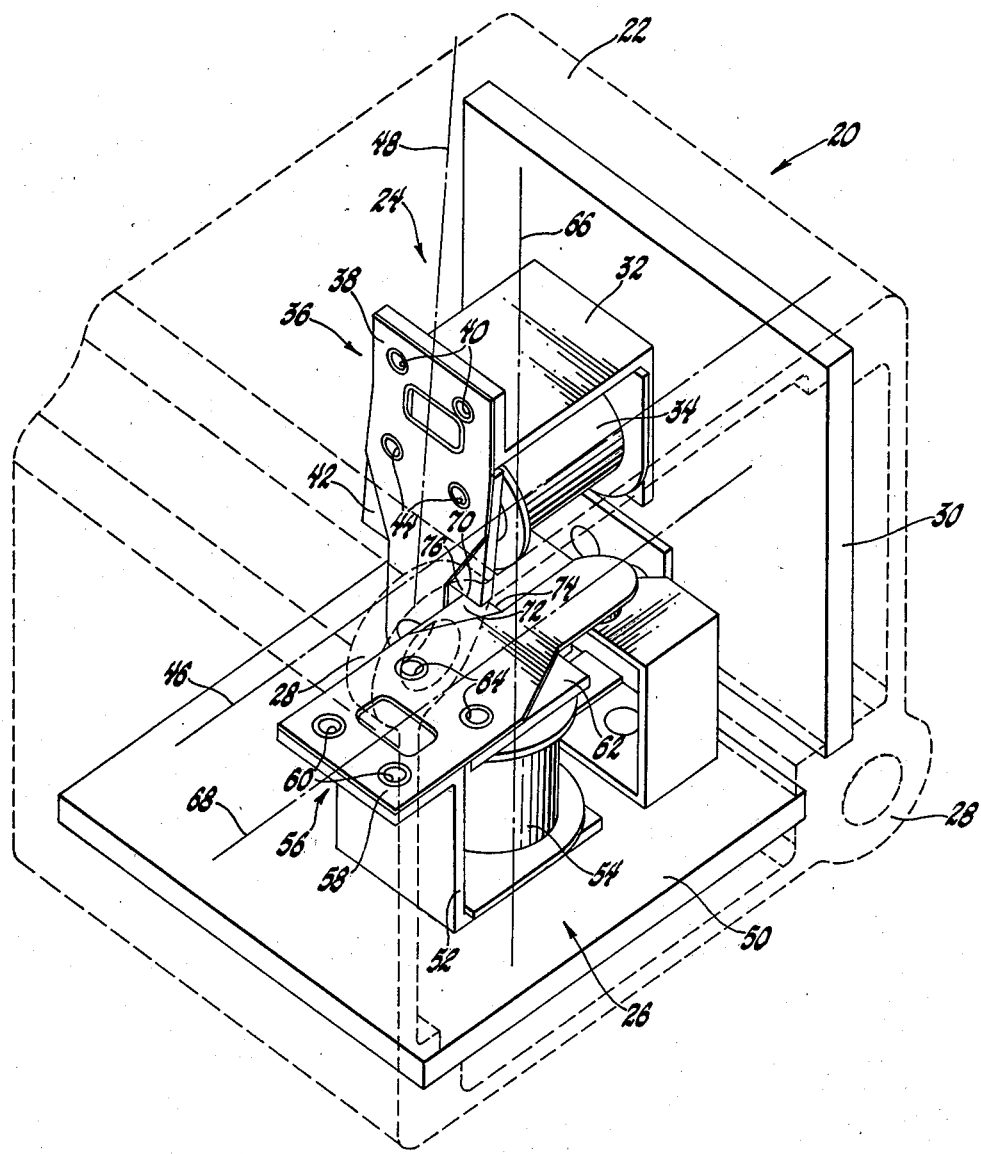
FIG. 1 is a perspective view showing the basic mechanical structure of a memory device according to the invention.

FIG. 1 is a simplified perspective view showing the mechanical structure of the novel memory device or latching relay according to the invention. Contact arrangement, external features, and interconnecting wiring have been omitted for clarity.

As shown in FIG. 1, a memory device or latching relay assembly 20 includes a case 22, a first or set relay 24, and a second or reset relay 26. Case 22 includes mounting provisions 28. First or set relay 24 includes a base member 30, to which is attached a frame member 32. A first coil assembly 34, including one or more windings and a core, is mounted to frame member 32. A flexible first armature member 36 includes a flexible member 38 attached to frame member 32 by mounting provisions 40 and a flux path member 42 attached to flexible member 38 by mounting provisions 44. First coil assembly 34 has a longitudinal axis 46, and armature member 36 has a second longitudinal axis 48, which is substantially perpendicular to first longitudinal axis 46. As will be apparent, armature member 36 moves over a small angle, and may be exactly perpendicular to first longitudinal axis 46 only at an intermediate portion of its travel. For purposes of this application, substantially perpendicular is hereby defined to allow for the small variation between a relay coil assembly and its armature over the travel of the armature, and to allow for relative movement of armatures of mutually-perpendicular relay coil assemblies.

Second or reset relay 26 includes a base member 50, a frame member 52 attached to base member 50, and a second coil assembly 54 including a core and at least one winding. A flexible second armature member 56 includes a flexible member 58 attached to frame member 52 by mounting provisions 60 and a flux path member 62 attached to flexible members 58 by mounting provisions 64. Coil assembly 54 has a third longitudinal axis 66, and armature member 56 has a fourth longitudinal axis 68, which is substantially perpendicular to axis 66.

As illustrated, first and second relays 24 and 26 are positioned within case 22 so that first longitudinal axis 46 of the first coil assembly 34 of the first or set relay 24 is perpendicular to the third longitudinal axis 66 of the second coil assembly 54 of the second or reset relay 26. As can be seen in FIG. 1, relays 24 and 26 are positioned so that one of their respective armature members 36 and 56 is free to move when the other is in energized position, by offsetting mutually perpendicular axes 46 and 66 by an amount less than half the total width of armature members 36 and 56. Therefore, when either is in de-energized position, the other will be held in energized position, either by an edge 70 of first armature member 36 overlapping a surface 72 of second armature member 56, or due to an edge 74 of second armature member 56 overlapping a surface 76 of first armature member 36. As shown, edge 70 overlaps surface 72 of second armature member 56, holding it in energized position, first armature member 36 being in deenergized position. When first coil assembly 34 is energized, it will attract flux path member 42 of first armature member 36, which will then move towards the energized position, edge 70 slipping off of surface 72 and allowing second armature member 56 to resiliently move to de-energized position, with its edge 74 then overlapping surface 76 of first armature member 36, and maintaining it in energized position. Energizing second coil assembly 54 while first coil assembly 34 is de-energized will return armature members 36 and 56 to the position shown in FIG. 1.

Figure 2:
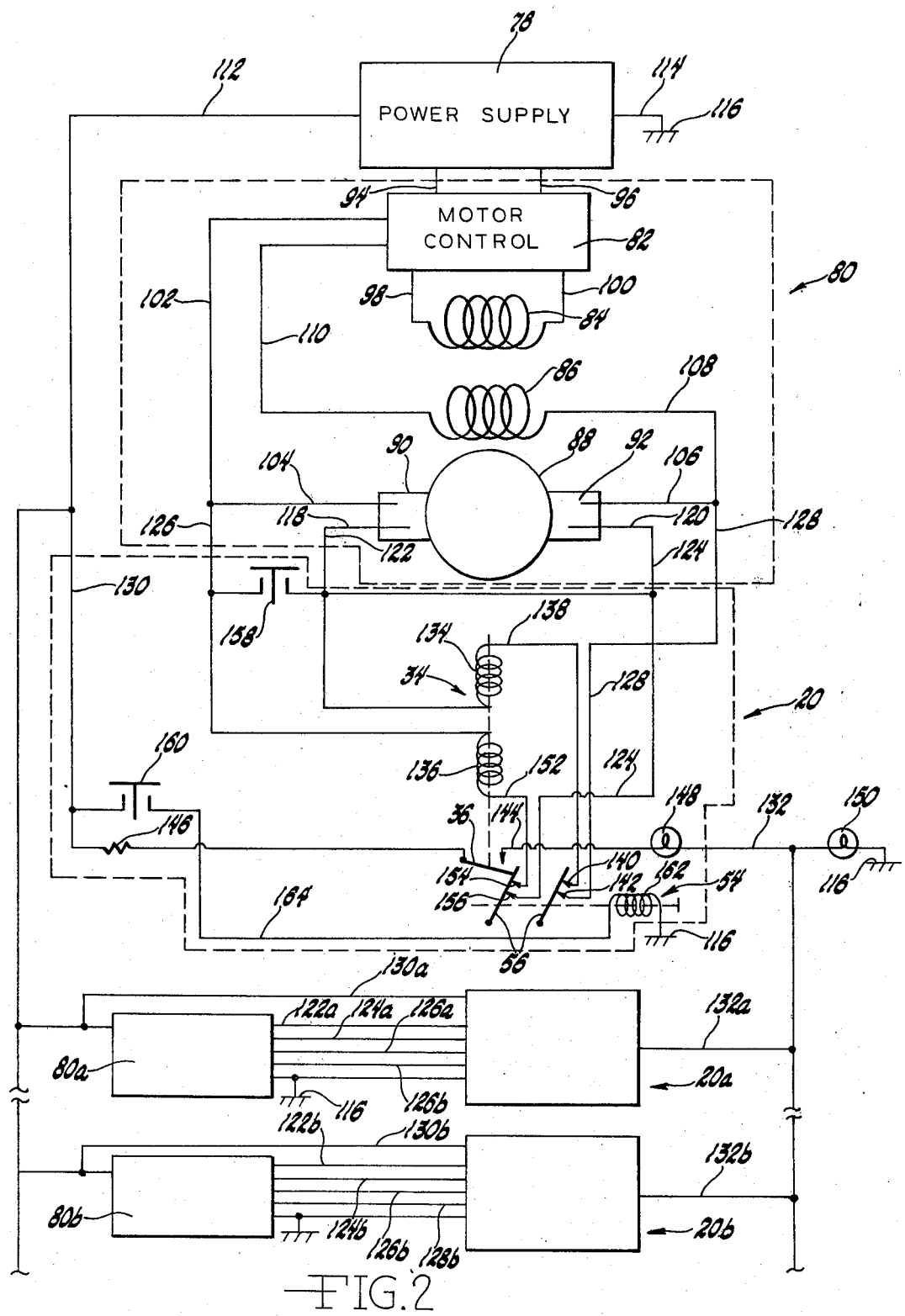
FIG. 2 is a schematic diagram of a preferred embodiment of a brush wear detecting system according to the invention, utilizing the memory device shown in FIG. 1.

Referring to FIG. 2, a power supply unit 78 is shown connected to a plurality of dynamoelectric machine units 80, 80a, 80b, and to a plurality of memory devices 20, 20a, 20b. As illustrated, dynamoelectric machine unit 80 includes a dynamoelectric machine shown as a variable-speed compound-wound direct current motor, including a motor control unit 82, a shunt field 84, a series field 86 and an armature 88 provided with brushes 90 and 92. As shown, brush 90 may be considered a positive brush and brush 92 may be considered a negative brush. As will be apparent, while two brushes are shown, any appropriate number may be used in accordance with the invention, providing that if the means for providing a brush wear signal indicative of critical brush wear of each brush provides a voltage signal of a given polarity, like means having like polarities should be connected in parallel to memory device or latching relay 20.

As illustrated, the preferred embodiment of the invention is intended for use on a mobile material-handling vehicle such as a fork-lift truck, including several dynamoelectric machines such as propulsion motors, hydraulic power supply motors, power steering pump motors, each provided with a separate memory device such as memory device or latching relay 20. As illustrated in FIG. 2, power supply 78 may have a voltage between approximately 24 and 72 volts in a typical application. Power supply 78 is connected to motor control unit 82 by lines 94 and 96. Motor control unit 82 supplies power to shunt field 84 through lines 98 and 100. Assuming brush 90 to be a positive brush, power flows from motor control unit 82 through line 102 to brush lead 104, into brush 90 through armature 38, through brush lead 106, line 108, and series field 86, and returns to motor control unit 82 through line 110. Power supply 78 has a positive output line 112 and a ground connection 114 connected to ground 116.

As can be seen, lines 104 and 106 are embedded in brushes 90 and 92 for a predetermined distance to carry power to armature 88. In the preferred embodiment, the means for providing a signal indicative of critical brush wear are sensing wires 118 and 120, embedded in brushes 90 and 92, respectively, for a predetermined distance slightly in excess of the distance that brush leads 104 and 106 are embedded. Sensing wires 118 and 120 are insulated about their periphery and at their respective tips. Therefore, as brushes 90 and 92 wear, before the lines or brush leads 104 and 106 contact and damage the armature 88, insulation will be abraded from the tip of the sensing wire 118 or 120, connecting it to the voltage present at brush 90 or 92 and its contact area with armature 88. Sensing wires 118 and 120 are connected to lines 122 and 124. Lines 126 and 128 are connected to lines shown as brush leads 104 and 106, respectively, and a line 130 is connected to positive output line 112. Lines 122, 124, 126, 128 and 130, together with a master warning line 132, pass into memory device or latching relay 20 in the form of a cable passing through an opening in case 22.

As illustrated, first coil assembly 34 includes coils 134 and 136, coils 134 and 136 being wound together upon a common core. In operation, for example, should sensing wire 118 contact armature 88 as brush 90 reaches a critical wear point, current will flow from sensing line 118, through line 122, through coil 134 connected to line 122, from coil 134 through a line 138 connected to coil 134, through contacts 140 and 142 connected between lines 138 and 128, and return through lines 128 and 108, series field 86, and line 110, to motor control 82. As will be apparent, current flowing through coil 134 attracts first armature member 36. First armature 36, as schematically illustrated, is connected to line 130 through a resistor 146, and forms one-half of a contact pair together with a contact 144. When the contact pair illustrated as armature 36 and contact 144 is closed, current will flow from line 130, through resistor 146 to a warning device shown as a light bulb or lamp 148, and thence to ground 116 through line 132 and master warning device shown as lamp 150. In the preferred embodiment of the invention, lamps 148 and 150 are light emitting diodes, lamp 148 being located on case 22 of latching relay 20, lamp 150 being located on a control panel for a mobile material handling vehicle, thus giving a warning indication of critical brush wear both near a dynamoelectric machine having a critically worn brush and at a central location.

As will be apparent from FIGS. 1 and 2, once armature 36 is attracted towards first coil assembly 34, armature 56 will be released from its energized position, and contacts 140 and 142 will be opened as armature 56 moves to latch armature 36 in energized position. Therefore, current flows through coil 134 or 136 only momentarily, so that, in a preferred embodiment of the invention, coil 134 or 136 produces sufficient flux to move armature 36 in a positive manner when 18 volts is applied across coil 134 or 136, and allows coil 134 or 136 to be used with a power supply 78 providing 72 volts DC or more, or 24 volts or less. As will be apparent, coils 134 and 136 being wound together, if sensing wire detects critical wear of negative brush 92, current will flow through line 126, through coil 136 connected to line 126, through line 152, through contacts 154 and 156, sensing wire 120, brush lead 106, and thence back to motor control unit 82. Current flowing in coil 136 attracts armature 36, closing contact 144, releasing armature 56 and opening contacts 154, 156 to deenergize coil 136, while armature 56 latches armature 36 in energized position, causing warning devices shown as lamps 148 and 150 to given an indication of critical brush wear.

As illustrated in FIG. 2, provisions are made for testing the operation of memory device 20 and of the brush wear detection system according to the invention, and for resetting memory device 20. A switching means shown as push-button switch 158 is provided, connected between line 126 and line 122. As will be apparent, operation of switch 158 connects line 126 to line 122, in the same manner as line 126 would be connected through brush lead 104, brush 90, and sensing wire 118 in the event of critical wear of brush 90. As previously described, current then flows through coil 134, moving armature 36 to energized position allowing armature 56 to move to deenergized position, providing an indication of critical brush wear at lamps 148 and 150. A second switch button switch 160 is provided to remove the indication or warning of critical brush wear after a test, or after a worn brush has been replaced. As will be apparent, operation of switch 160 connects winding 162 of second coil assembly 54 through line 164, energizing winding 162 to move armature 56 to its energized position, closing contacts 140, 142 and 154, 156, and allowing armature 36 to move from energized position and to latch armature 56 in energized position.

As shown in FIG. 2, any number of dynamoelectric machine units such as units 80a, 80b may be connected to memory devices such as 20a, 20b, and to a central or master warning device such as lamp 150 in accordance with the invention. In FIG. 2, corresponding reference numerals, with appropriate suffixes, are used to identify the interconnection between various dynamoelectric machine units 80, 80a, 80b and memory devices 20, 20a, 20b.

Figures 3, 4:
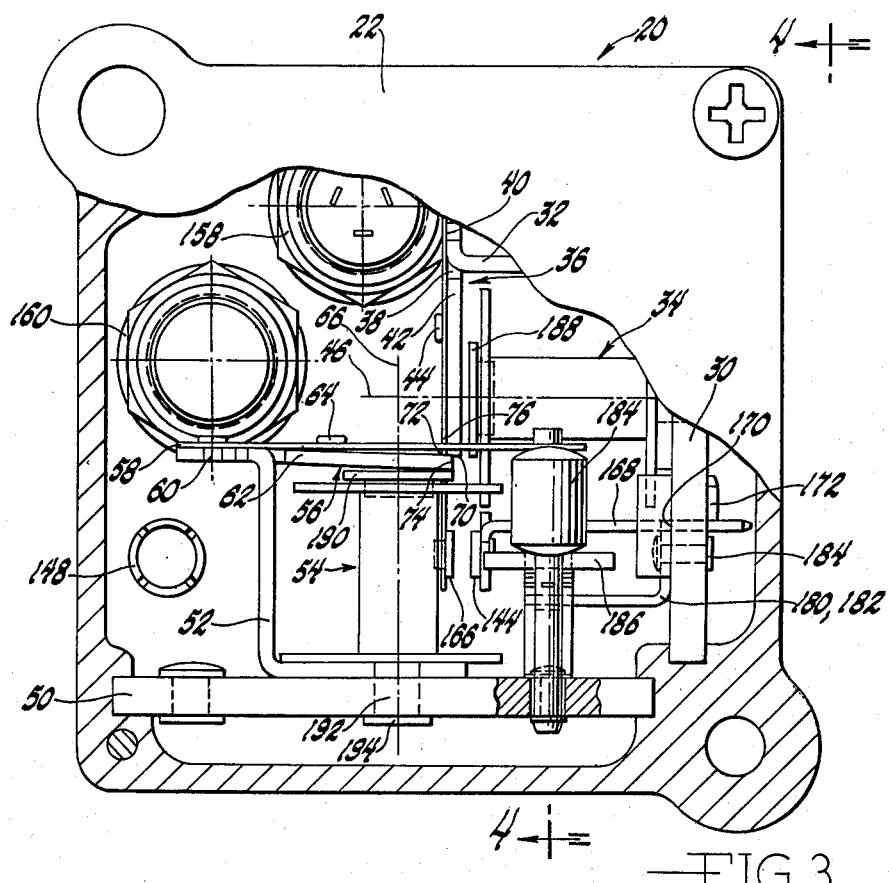
FIG. 3 is a side elevational view, partially in section, of a memory device or latching relay in accordance with the invention.
FIG. 4 is a second view of the memory device or latching relay shown in FIG. 3 taken in direction 4—4 in FIG. 3.

FIGS. 3 and 4 are elevational views of a memory device 20 in accordance with the invention. For clarity, internal wiring has been shown schematically in FIG. 2, and omitted from FIGS. 3 and 4, along with the six-wire cable containing lines 122, 124, 126, 128, 130 and 132. The contact arrangement of the preferred embodiments of relays 24 and 26 are shown in detail. Resilient flexible member 38 of armature member 36 of set relay 24 is provided with a contact 166, cooperating with contact 144 to provide a critical brush wear warning signal through lamp 148 in response to energization of first coil assembly 34. As can be seen, contact 144 is disposed upon bracket member 168, which is retained in base member 30 by means of shoulders 170 on one side of base member 30 and tab 172, bent to form a right angle with bracket 168 on the opposite side of base member 30. As can be seen from FIGS. 3 and 4, contacts 140 and 156 are mounted to base member 50 by means of bracket members 174 and 176, fastened to base member 50 by fastening means shown as rivets 178. Mating contacts 142 and 154 are fastened on bracket members 180 and 182, which are retained to base member 30 by means of fastening means shown as rivets 184.

As shown in FIGS. 3 and 4, armature 36 is in de-energized position, and second armature member 56 is in energized position, and being held in energized position by edge 70 bearing against surface 72. In this condition, contacts 144, 166 are open, and resilient flexible member 58 of armature 56 presses against actuator pin 184, made of an insulating material, which carries insulating washer 186. Insulating washer 186 presses against bracket members 174, 176, forcing contacts 140, 156 against contacts 142, 154, thus enabling coil assembly 34 to be energized by a critical brush wear signal. When coil 134 or 136 of first coil assembly 34 is energized, flux path member 42 will be drawn towards first core member 188, closing contacts 144, 166, and releasing armature 56, opening contacts 140, 142 and 154, 156 while edge 74 latchingly engages surface 76 of armature 36 to maintain contacts 166, 144 in energized position. Memory device 20 is reset by energizing coil 162 of second coil assembly 54, drawing flux path member 62 towards second core member 190. As shown, second or reset relay 26 is retained to base member 50 by means of an end 192 of second core member 190 which passes through an appropriate aperture in base member 50 and has a portion 194 which is widened by cross-staking or riveting to assemble relay 26 to base member 50.

As will be apparent, numerous variations and modifications of the disclosed memory device or latching relay and brush wear detection system utilizing such a relay will be obvious to one skilled in the art, including but not limited to the substitution of other means for providing a critical brush wear signal, and the deletion or addition of contacts from perpendicularly mounted relays with substantially perpendicularly overlapping armature members, as will be obvious to one skilled in the art, and may be easily made without departing from the spirit and scope of the invention.

I claim:

1. A brush wear detection system, comprising:
a dynamoelectric machine having a plurality of brushes;
at least one sensing wire means for providing a brush wear signal indicative of critical brush wear;
a latching relay operatively connected to said sensing wire means;
said latching relay including a set relay and a reset relay;
said set relay having a first frame, a first coil assembly responsive to said brush wear signal including a first core and at least one first winding, and a first movable armature, said first coil assembly having a first longitudinal axis and a first armature having a second longitudinal axis, said first axis being substantially perpendicular to said second axis;
said reset relay having a second frame, a second coil assembly including a second core and a second winding, and a second moveable armature;
said second coil assembly having a third longitudinal axis and said second armature having a fourth longitudinal axis, said third axis being substantially perpendicular to said fourth axis;
said set relay being disposed perpendicularly to said reset relay, said first axis being perpendicular to said third axis and said second axis being substantially perpendicular to said fourth axis;
said first axis intersecting said second axis, and said third axis intersecting said fourth axis, said second axis being substantially parallel to said third axis and said first axis being substantially parallel to said fourth axis, and said third axis being substantially spaced from said second axis;
said first armature having an energized position and a de-energized position responsive to said first coil assembly;
said second armature having an energized position and a de-energized position responsive to said second coil assembly;
said first armature substantially perpendicularly overlapping a portion of said second armature and latching said second armature in said energized position when said first armature is in said de-energized position;
said second armature substantially perpendicularly overlapping a portion of said first armature and latching said first armature in said energized position when said first armature has moved to said energized position responsive to said first coil assembly;
said set relay including a pair of alarm contacts operatively connected to a source of power and to an alarm means for providing an indication of brush wear responsive to said sensing wire.

2. A brush wear detection system according to claim 1, wherein:
said first coil assembly includes two said first windings, each said first winding being operatively connected to one said sensing wire means embedded in one said brush of said dynamoelectric machine.

3. A brush wear detection system according to claim 2, wherein:
said reset relay includes at least one pair of second contacts operably connected to at least one said first winding of said set relay, said second contacts being closed contacts when said first armature is in said de-energized position, and being open contacts when said first armature is moved to said energized position responsive to said first coil assembly and latched in said energized position by said second armature of said reset relay, said second open contacts disabling said first coil.

4. A brush wear detection system according to claim 3, wherein:
said system includes reset means operably connected to said second coil assembly of said reset relay for moving said second armature to said energized position responsive to said second coil assembly and unlatching said first armature of said set relay to said de-energized position.

5. A latching relay assembly, comprising:
a set relay having a first frame, a first coil assembly including a first core and at least one first winding, and a first moveable armature, said first coil assembly having a first longitudinal axis and said first armature having a second longitudinal axis, said first axis being substantially perpendicular to said second axis;

a reset relay having a second frame, a second coil assembly including a second core and at least one second winding, and a second moveable armature, said second coil assembly having a third longitudinal axis and said second armature having a fourth longitudinal axis, said third axis being substantially perpendicular to said fourth axis;

said set relay being disposed perpendicularly to said reset relay, said first axis being perpendicular to said third axis, and said second axis being substantially perpendicular to said fourth axis;

said first axis intersecting said second axis and said third axis intersecting said fourth axis, said second axis being substantially parallel to said third axis and said first axis being substantially parallel to said fourth axis, and said third axis being substantially spaced from said second axis;

said first armature having an energized position and a de-energized position responsive to said first coil assembly;

said second armature having an energized position and a de-energized position responsive to said second coil assembly;

said first armature substantially perpendicularly overlapping a portion of said second armature and latching said second armature in said energized position when said first armature is in said de-energized position;

said second armature substantially perpendicularly overlapping a portion of said first armature and latching said first armature in said energized position when said second armature is in said de-energized position.

* * * * *